US009613924B2

(12) United States Patent
Aliane et al.

(10) Patent No.: US 9,613,924 B2
(45) Date of Patent: Apr. 4, 2017

(54) METHOD OF FLIP-CHIP ASSEMBLY OF TWO ELECTRONIC COMPONENTS BY UV ANNEALING, AND ASSEMBLY OBTAINED

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Amélie Revaux, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/902,426

(22) PCT Filed: Jul. 1, 2014

(86) PCT No.: PCT/IB2014/062767
§ 371 (c)(1),
(2) Date: Dec. 31, 2015

(87) PCT Pub. No.: WO2015/001484
PCT Pub. Date: Jan. 8, 2015

(65) Prior Publication Data
US 2016/0372443 A1    Dec. 22, 2016

(30) Foreign Application Priority Data

Jul. 2, 2013  (FR) ...................... 13 56442

(51) Int. Cl.
*H01L 23/495*  (2006.01)
*H01L 23/00*  (2006.01)
(Continued)

(52) U.S. Cl.
CPC .......... *H01L 24/73* (2013.01); *H01L 21/4853* (2013.01); *H01L 21/4867* (2013.01);
(Continued)

(58) Field of Classification Search
CPC ........................... H01L 24/73; H01L 21/4853
(Continued)

(56) References Cited

U.S. PATENT DOCUMENTS 5,037,780 A     8/1991  Fujimoto et al.
5,829,125 A  *  11/1998  Fujimoto ............. B23K 1/0056
                                            219/121.64
(Continued)

FOREIGN PATENT DOCUMENTS

JP    H03141656    6/1991
JP    2006269119   10/2006

OTHER PUBLICATIONS

Fleisch T.H. et al.: "Reduction of Copper Oxides by UV Radiation and Atomic Hydrogen Studied by XPS", Applications of Surface Science, 10, (1982), pp. 51-62.

*Primary Examiner* — Jami M Valentine
(74) *Attorney, Agent, or Firm* — Norton Rose Fulbright US LLP

(57) ABSTRACT

The invention concerns a method of flip-chip assembly between first (1) and second (2) components each comprising connection pads (11, 21) on one of the faces of same, referred to as assembly faces, which involves transferring the components onto each other via the assembly faces of same in such a way as to create electrical interconnections between the pads of the first and second components. The invention involves transforming the copper oxide into copper by UV annealing, very locally, in the gap between the components, at least around the areas adjacent to the connection pads. The method according to the invention can be used for any component that is transparent to UV rays, including for substrates made from a plastic material such as substrates made from PEN or PET. The invention also concerns the assembly of two components obtained by the method.

21 Claims, 4 Drawing Sheets

(51) Int. Cl.
   *H01L 23/498*   (2006.01)
   *H01L 21/48*   (2006.01)
(52) U.S. Cl.
   CPC .......... *H01L 23/4985* (2013.01); *H01L 24/05* (2013.01); *H01L 24/13* (2013.01); *H01L 24/29* (2013.01); *H01L 24/81* (2013.01); *H01L 24/83* (2013.01); *H01L 24/92* (2013.01); *H01L 2224/0401* (2013.01); *H01L 2224/05017* (2013.01); *H01L 2224/05026* (2013.01); *H01L 2224/05082* (2013.01); *H01L 2224/05124* (2013.01); *H01L 2224/05144* (2013.01); *H01L 2224/05155* (2013.01); *H01L 2224/05166* (2013.01); *H01L 2224/05169* (2013.01); *H01L 2224/13026* (2013.01); *H01L 2224/13109* (2013.01); *H01L 2224/13111* (2013.01); *H01L 2224/13124* (2013.01); *H01L 2224/13144* (2013.01); *H01L 2224/13147* (2013.01); *H01L 2224/29147* (2013.01); *H01L 2224/73204* (2013.01); *H01L 2224/8122* (2013.01); *H01L 2224/81125* (2013.01); *H01L 2224/8322* (2013.01); *H01L 2224/83125* (2013.01); *H01L 2224/92225* (2013.01); *H01L 2924/014* (2013.01)

(58) Field of Classification Search
   USPC .......................................... 257/668
   See application file for complete search history.

(56) References Cited

U.S. PATENT DOCUMENTS

2009/0152742 A1* 6/2009 Ikeguchi ............... H05K 1/144
   257/778
2010/0212403 A1* 8/2010 Seal .................... G01N 33/005
   73/31.06

* cited by examiner

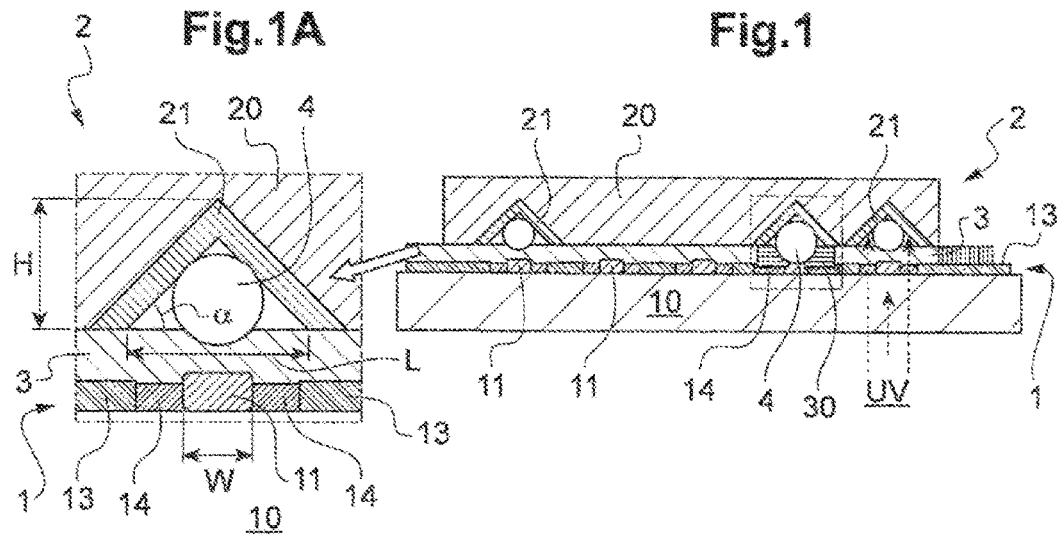
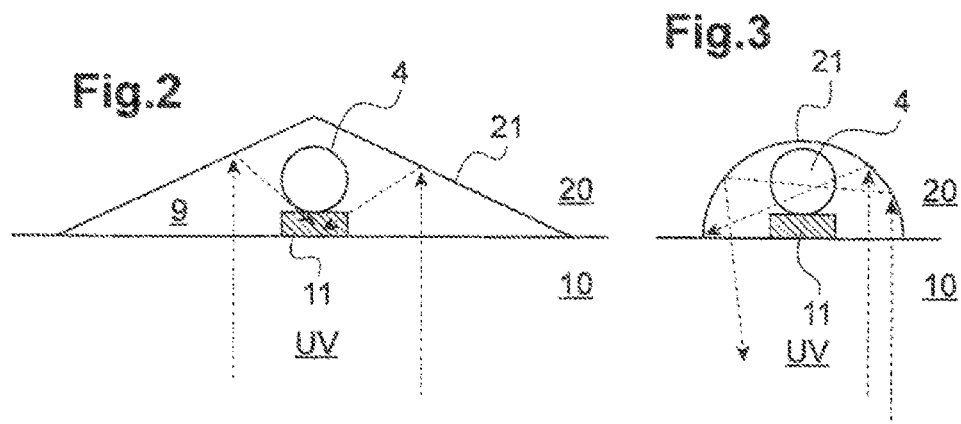
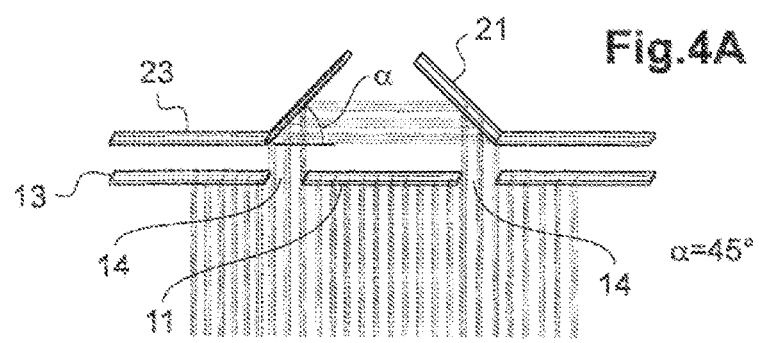

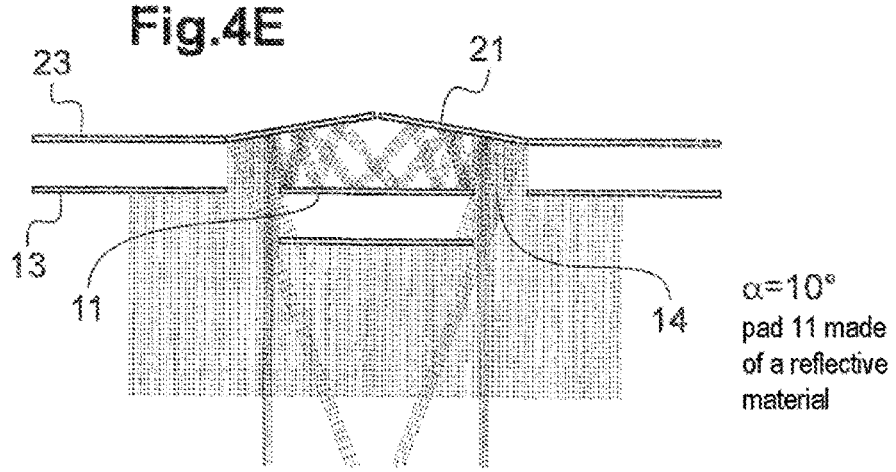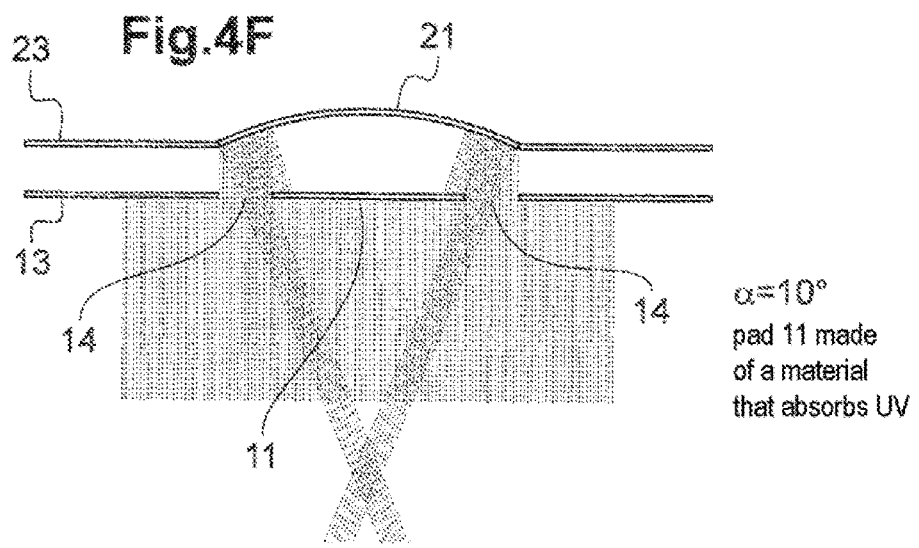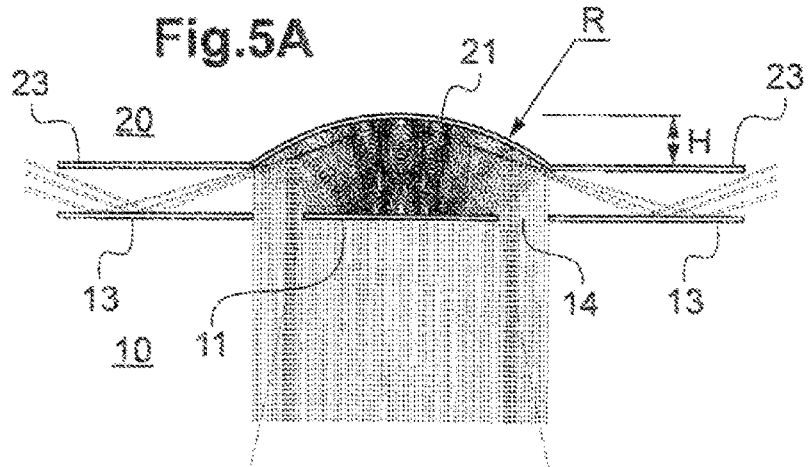

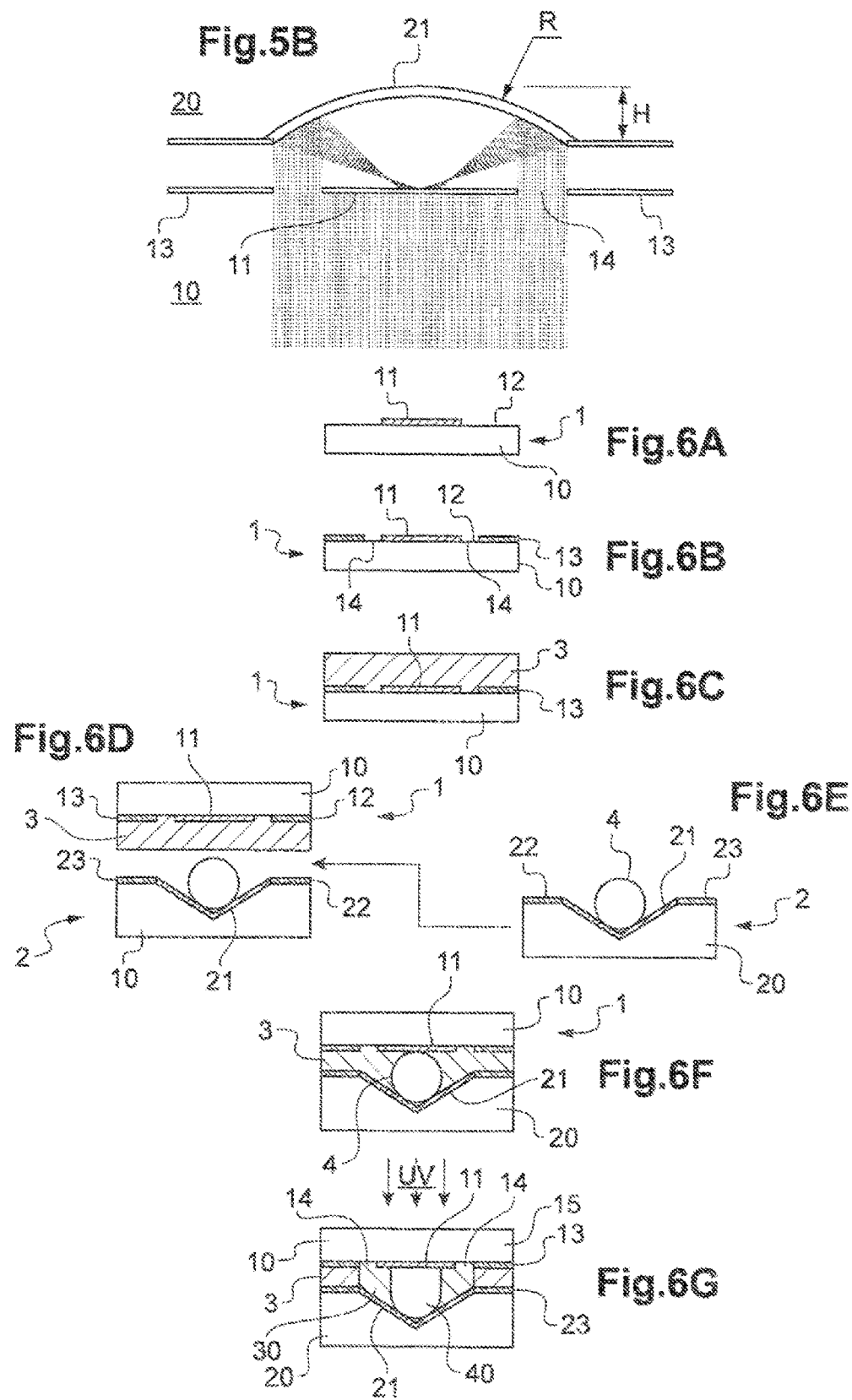

METHOD OF FLIP-CHIP ASSEMBLY OF TWO ELECTRONIC COMPONENTS BY UV ANNEALING, AND ASSEMBLY OBTAINED

CROSS-REFERENCE TO RELATED APPLICATIONS

This application is a national phase application under 35 U.S.C. §371 of International Application No. PCT/IB2014/062767 filed 1 Jul. 2014, which claims priority to French Patent Application No. 13/56442 filed 2 Jul. 2013. The entire contents of each of the above-referenced disclosures is specifically incorporated herein by reference without disclaimer.

TECHNICAL FIELD

The present invention relates to a flip-chip process for assembling two electronic components together, in which one of the two electronic components is flipped in order to make it possible to form the electrical connections or joints vertically.

The invention makes it possible to obtain an assembly between electronic components, one of which is at least partially transparent to ultraviolet (UV) radiation, whatever their interconnection pitch and the spacing between these components.

The invention more particularly relates to the assembly of a chip, for example made of silicon, and a substrate that is transparent to UV, such as one made of polyethylene naphthalate (PEN), polyethylene terephthalate (PET) or of glass.

The substrates may advantageously be flexible.

The expression "assembly of two electronic components" is understood, in the context of the invention, both to mean an assembly of two components of different materials, usually called hybridization, one of which is a material that is transparent to UV, and assembly of two components made of the same UV-transparent material.

In particular, an assembly process according to the invention may relate to assembly of an electronic chip and a substrate, both possibly being made of a material that is transparent to UV.

The expression "interconnection pitch" is understood to mean the distance between two connection pads on a given electronic component.

The expression "spacing between components" is understood to mean the separation between the two facing components defined by the interconnection height.

The expression "transparent to UV radiation" is understood to mean a material that lets a sufficient amount of UV radiation pass, by transmission therethrough, to allow copper oxide to be annealed directly and by reflection from a material that reflects UV radiation, which is arranged facing.

PRIOR ART

The so-called flip-chip technique is a well-known technique for obtaining the mechanical and electrical interconnection, or assembly, of two components, such as a chip and the substrate of a printed circuit board.

This technique is referred to as the flip-chip technique because one of the components, in general the chip, which bears conductors (pads), is flipped in order to place, aligned, the two components face-to-face, in order to allow the interconnections to be obtained by fusing the conductors and metal protuberances, commonly referred to as "bumps", which in general are ball-shaped, forming contacts on the other component, in general a substrate.

Three broad categories of flip-chip assemblies are currently known: it is a question of soldering, thermocompression and, advantageously, insertion and use of adhesives such as ACFs (anisotropic conductive films).

In soldered assemblies, which are the most common type of assembly, the bumps, called solder bumps, which are typically made of indium (In), are reflowed to produce an electrical connection. Reflow is typically obtained by ultrasound or by what is called a reflow process, i.e. by blanket heating of the entirety of both components added one to the other, for example achieved by placing the two components under an atmosphere of controlled temperature: the heating thus makes the bumps reflow and form the electrically interconnecting solder joints.

In most cases, an electrically insulating adhesive fills the space between the circuits of one component and the other component in order to ensure a strong mechanical bond, to produce a thermal bridge, and to assure that the solder joints are not stressed in operation because of the differential thermal expansion coefficient (TEC) between the two components.

A major drawback with the soldering process is that reflow of metal bumps requires high temperatures, typically higher than 156° C., the latter being the melting point of the indium generally forming the bumps. However, these temperatures are not compatible with organic components, especially components made of plastics, such as polyethylene naphthalate (PEN) or polyethylene terephthalate (PET), which have glass transition temperatures below the melting points of the constituent soldering materials of the bumps. Specifically, the glass transition temperature of PEN is 120° C. and that of PET is 70° C. Thus, if a component made of plastic is subjected to a temperature equal to the melting point of the solder bumps during conventional soldering, said component passes into a rubbery state and deforms greatly, or is even destroyed.

Another substantial drawback associated with the addition of silicon or germanium chips to substrates made of flexible plastics is the intrinsic incompatibility of their thermal expansion coefficients (TECs).

Lastly, high costs are associated with the high temperatures required by conventional soldering during the hybridization of chips.

By way of illustration of a conventional soldering process, mention may be made of U.S. Pat. No. 7,772,041 B2, which describes a method for interconnecting two elements under vacuum or in a controlled atmosphere with the use of a wetting surface, which is of larger area than the other, to receive meltable indium bumps. In this method the entire board is heated to a very high temperature via the substrate holder.

In the field of microelectronics, the lamps referred to as UV flash lamps, which emit UV radiation for a very short time, have already been used.

Patent application US 2011/0262657 A1 thus describes a method for manufacturing a thin electrically conductive film by reduction, in order to make them electrically conductive, with a chemical agent sensitive to flash UV.

Patent application US 2010/0000762 A1 describes the use of a UV flash lamp to convert copper oxide into copper nanoparticles of electrical resistivity of about $5 \times 10^4$ $\Omega \cdot cm$, between two conductive zones. A metal wire is added to connect the two conductive zones, and thus reinforce the electrical contact.

Lastly, the Applicant filed on 21 Aug. 2012 under the number FR 1 257 897 a patent application relating to a method for hybridizing two components by applying ultraviolet radiation (UV), transmissively through one of the UV-transparent components and its connection pads, taking the form of UV-transparent layers, directly to interconnection elements based on copper oxide so as to anneal the latter into copper. This method requires an additional step of distributing electrically insulating ink in the space between components in order to mechanically solidify the two hybridized components.

There is therefore a need to improve processes for flip-chip assembly of two components, especially in order to obviate the need to apply high temperatures to the entirety of both components to produce electrical interconnections therebetween.

The general aim of the invention is to at least partially meet this need.

One particular aim of the invention is to provide a solution that obviates the need, once the assembly has been produced, for an additional step allowing the assembly to be mechanically solidified, and that enables good evacuation of the heat due to the operation of one and/or other of the assembled components.

SUMMARY OF THE INVENTION

To do this, the subject of the invention is firstly a process for flip-chip assembly of a first component and a second component, each component including connection pads on one of their faces, called their assembly faces, in which the components are added one to the other via their assembly faces so as to produce electrical interconnections between the pads of the first and those of the second component, the process including the following steps:

a/ producing the first component with its connection pads, the first component being made of a material that is transparent to ultraviolet (UV) radiation in zones, called emission zones, each of said emission zones being defined around a pad, the pads of the first component being made of a material that absorbs or reflects UV radiation;

b/ depositing copper oxide (CuO) on the first component at least on its connection pads and in the emission zones;

c/ producing the second component with its connection pads, the connection pads of the second component being made of a material that reflects UV radiation, each of said pads being suitable for reflectively focusing ultraviolet radiation arriving from an emission zone onto one of the pads of the first component, and, depending on the circumstances, onto each metal protuberance formed on a pad of the second component;

d/ forming interconnection metal protuberances on at least some of the pads of the second component;

e/ aligning the first and second components and adding them one to the other via their assembly faces; and f/ applying UV radiation through the emission zones of the first component to the deposited copper oxide so as to carry out a UV anneal that converts the deposited copper oxide into copper and, depending on the circumstances, makes the interconnection protuberances melt.

In other words, according to the invention, the copper oxide is converted into copper by a UV anneal, very locally in the space between components at least around zones in line with the connection pads. Such a UV anneal does not require the assembly to be subjected to a blanket heat treatment, such as that required in prior-art soldering processes.

Furthermore, reflectively focusing the UV radiation allows high temperatures to be achieved very locally in interconnection protuberances when they are present. Thus, it is possible to melt a conventionally used solder metal, such as indium, while achieving very fine control of the melting of the electrical interconnections and in the space between the two components.

Thus, the process according to the invention may be applied to any component that is transparent to UV, including to substrates made of a plastic the glass transition temperature of which is however below the protuberance reflow temperature achieved locally. It is especially possible to use substrates that are transparent, flexible and cheap to produce, such as substrates made of PEN or PET.

Thus, by virtue of the invention, it is possible to obtain electrical interconnections with a very good electrical conductivity from the copper formed from the CuO and, at the same time, to enhance, with the reflowed protuberances, mechanical and electrical conductivity.

Furthermore, if the copper oxide (CuO) is deposited in the form of a continuous layer or film, i.e. even in zones other than the electrical interconnection zones, it is possible to obtain a very good dissipation of the heat due to heating of at least one of the components, such as a chip, in operation, just by virtue of the presence of the continuous film.

The invention has many advantages, among which mention may be made of:

the low temperatures applied by UV radiation, which allow both the copper oxide to be converted into copper and the interconnection protuberances, such as indium bumps, to be reflowed;

the connection elements obtained comprising the copper formed from the copper oxide CuO and the reflowed metal protuberances, such as reflowed indium bumps, are directly passivated by the deposited copper oxide film not subjected to UV radiation;

a very low electrical resistivity is obtained for the electrical interconnections (contacts) between the two components;

excellent removal of the heat generated by the operation of at least one of the components, such as a silicon chip, is obtained by way of the CuO film, which has a thermal conductivity coefficient of 33 W/m·K, notably much better than air, of thermal conductivity coefficient conductivity equal to 0.02 W/m·K;

very good matching of the TEC coefficients of the assembled components is obtained because of the CuO film;

a small interconnection pitch is possible;

the costs of the assembly steps for a component made of plastic are limited;

it is possible to align the components via the back face of the transparent component;

there is no need for an additional step of adding an insulating ink in the space between components, followed by a step of thermally annealing this insulating ink in order to mechanically solidify the interconnections as in patent application FR 1 257 897; and better mechanical and electrical interconnections are obtained than in patent application FR 1 257 897, by virtue of the reflow of the metal protuberances, such as indium bumps, simultaneously with the conversion into copper.

According to one advantageous embodiment, the first component includes a substrate made of a material that is transparent to UV.

According to one advantageous embodiment, one of the components is a chip and the other component is a substrate made of transparent material surmounted, on the same side as its assembly face, with an electrically insulating layer made of a material that absorbs or reflects UV radiation, said layer defining the emission zones.

Preferably, the constituent material of the layer defining the emission zones is chosen from a titanium oxide, such as $TiO_2$, zinc oxide (ZnO), zirconium oxide ($ZrO_2$) and molecules of pyrene dissolved in acetone.

According to another advantageous embodiment, the first component is a substrate made of transparent material surmounted, on the same side as its assembly face, with a layer made of a material that absorbs or reflects UV radiation and electrically insulated from the emission zones and connection pads.

Preferably, the constituent material of the layer electrically insulated from the emission zones and connection pads is a metal such as gold (Au), titanium (Ti) or nickel (Ni).

According to one advantageous embodiment, the first component is a substrate made of transparent material and in which the emission zones are defined by drops of a solvent that absorbs UV radiation added to copper oxide (CuO).

Preferably, the solvent is chosen from water, acetonitrile, pentane, n-hexane, cyclohexane and cyclopentane.

Step b/ is preferably carried out by depositing CuO in the form of an ink in order to produce a film covering the assembly face of the first component.

According to one advantageous variant, between steps e/ and f/, a step e1/ of thermally annealing the copper oxide (CuO) ink is carried out between 90 and 100° C. for a time of 10 min to 30 min so as to thermally activate the copper oxide.

According to one advantageous variant, the UV radiation applied in step f/ consists in a photonic pulse of a duration comprised between 0.5 and 2 milliseconds (ms) having an energy comprised between 10 and 20 joules/cm$^2$.

Another subject of the invention is an assembly of two components, especially obtained using the process just described.

Thus, the invention relates to an assembly of a first component and a second component, each component including connection pads on one of their faces, called their assembly faces, in which:

the first component is made of a material that is transparent to ultraviolet radiation (UV) at least in zones, called emission zones, and includes connection pads made of a material that absorbs or reflects UV radiation, said pads each being bounded by emission zones; and the second component includes connection pads made of a material that reflects UV radiation.

According to the invention, the assembly includes:

interconnection zones made of copper (Cu) each filling the space at least between the emission zones of the first component and a pad of the second component; and depending on the circumstances, metal protuberances each reflowed in an interconnection zone between a pad of the first component and a pad (21) of the second component.

According to one advantageous embodiment, the first component includes a substrate made of a material that is transparent to UV. Advantageously, the substrate is made of polyethylene naphthalate (PEN), polyethylene terephthalate (PET) or of glass.

According to another advantageous variant, the connection pads of the second component are made of a material that reflects UV radiation and have a concave shape relative to the assembly face, the concave shape consisting of a parabolic or cylinder segment.

According to another advantageous variant, the connection pads of the second component are made of a material that reflects UV radiation and have a recessed, Isosceles-triangle shape relative to the assembly face.

The angle α at the base, angle formed between the two sides of the Isosceles triangle and the assembly face of the second component, is preferably smaller than 40°, preferably smaller than 30° and more preferably smaller than 10°.

Advantageously, the connection pads of the first component are made of a material that reflects UV radiation.

Preferably, the connection pads of the second component are produced in the form of a metal layer the metal of which is chosen from aluminum (Al), gold (Au), titanium (Ti), nickel (Ni) and platinum (Pt), or of a metal bilayer chosen from nickel surmounted with gold (Ni/Au) and nickel surmounted with platinum (Ni/Pt).

Also preferably, the constituent material of the interconnection protuberances is chosen from indium (In), an aluminum-copper alloy (AlCu), tin (Sn) and a gold-tin alloy (AuSn).

According to one advantageous embodiment, the second component is a chip, in particular a silicon chip, and the first component is a substrate made of transparent material surmounted, on the same side as its assembly face, with a layer that absorbs UV radiation, defining the emission zones.

BRIEF DESCRIPTION OF THE DRAWINGS

Other advantages and features of the invention will become more clearly apparent on reading the detailed description of the invention, which is given by way of nonlimiting illustration, with reference to the following figures, in which:

FIG. 1 is a schematic cross-sectional view illustrating an assembly of two components after they have been assembled according to the invention;

FIG. 1A is a detail view of FIG. 1;

FIGS. 2 and 3 are schematic cross-sectional views illustrating the optical paths of rays resulting from the reflection by reflection of UV radiation in a step of the process according to the invention, the step being implemented with connection pads made of reflective material in the shape of an Isosceles triangle and of a cylinder segment, respectively;

FIGS. 4A to 4F are schematic cross-sectional views illustrating various foci for UV radiation reflected in a step of the process according to the invention, the step being implemented with connection pads made of reflective material in the shape of an Isosceles triangle having various angles at the base;

FIGS. 5A and 5B are schematic cross-sectional views illustrating various foci for UV radiation reflected in a step of the process according to the invention, the step being implemented with connection pads made of reflective material in the shape of a cylindrical segment; and FIGS. 6A to 6G are schematic cross-sectional and detail views illustrating the various steps of a process according to the invention.

DETAILED DESCRIPTION

Figure 4B:
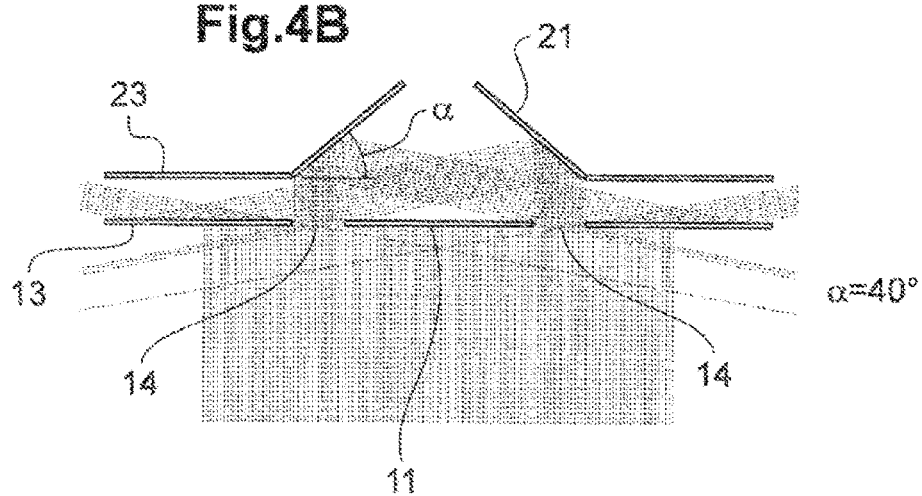

FIGS. 1 and 1A show an assembly of two electronic components 1, 2, such as a component 1 with a flexible substrate 10 made of PEN or PET and an electronic chip 2 made of silicon, before it has been subjected to UV radiation according to the invention.

The component 1, which is the flipped component, includes a substrate 10 that is transparent to UV radiation, on the assembly face 12 of which connection pads 11 of equal height have been produced. By way of example, the width W of a connection pad 11 is about 40 µm.

Between two connection pads 11, a layer 13 made of an electrically insulating material and that absorbs UV radiation is deposited. This layer 13 defines, around each connection pad 11, an emission zone 14 able to let UV radiation pass.

The component 2, which is the flipped component, includes, for its part, a substrate 20 made of silicon, on the assembly face 12 of which connection pads 21 of equal height have been produced. The connection pads 21 are made of a material that reflects UV. The geometric shape of each connection pad is an Isosceles triangle with an angle at the base α preferably smaller than 40°, as will be explained below. By way of example, the width L of the base of the triangle of a pad 21 is about equal to 60 µm and the height H of the triangle of a pad 21 is equal to 10 µm.

Each of the connection pads 21 is surmounted by a metal connection protuberance 4 in the form of a bump made of meltable material. Typically, it is a question of an indium bump 4. Between two connection pads 21 is deposited a layer 23 made of an electrically insulating material and that absorbs UV radiation.

The interconnection pitch between two consecutive pads 21 is at least equal to 40 µm.

As may be best seen in FIG. 1A, before the components were added one to the other a continuous layer 3 of copper oxide CuO was deposited on the connection pads 11 and on the layer 13 made of an electrically insulating material and that absorbs UV.

According to the invention, to finalize the assembly once the flipped component 2 has been added to the other component 1, UV radiation is applied through the emission zones 14 of the first component 1 to the deposited copper oxide 3 so as to implement a UV anneal converting the deposited copper oxide into copper, and to make the interconnection protuberances 4 melt. The UV radiation that passes through the emission zones 14 is reflected from each pad 21, the shape of which is adapted to focus as best as possible the UV radiation onto the protuberance 4 and onto the connection pad 11.

Thus, in the interconnection zones 3, 4, localized conversion of the CuO into Cu is obtained while the protuberances 4 are simultaneously melted.

Therefore, in the end, an assembly having a good electrical contact made of copper is obtained while at the same time a good mechanical and electrical contact is obtained via the molten material of the protuberances 4. A good dissipation of heat due to heating of the component 2 in operation is also obtained by way of the layer 3 of CuO.

It is possible to vary the shape of the connection pads 21 in order to obtain a good focus on a connection protuberance 4, in order to make it melt, and on the subjacent connection pad 11. Thus, it may advantageously be a question of an Isosceles-triangle shape (FIG. 2) or a cylinder-segment shape (FIG. 3).

The impact of the concave shape of the connection pads 21, of the angle α at the base made between the two sides of the Isosceles triangle and the assembly face 22 of the second component 2 when the pads 21 are triangle-shaped, and lastly of the material that reflects and absorbs UV, on their focus of UV radiation onto the connection bumps 4, and therefore on whether or not it is possible to make the latter melt, has been studied.

This study was carried out using the commercial ray-tracing software package "Trace pro 6.0". This software package was developed by Lambda Research Corp.

Firstly, simulations were carried out with pads 21 having an Isosceles-triangle shape, then their angle at the base α, at the base formed between the two sides of the Isosceles triangle and the assembly face 22 of the second component 2, was varied.

Figure 4C:
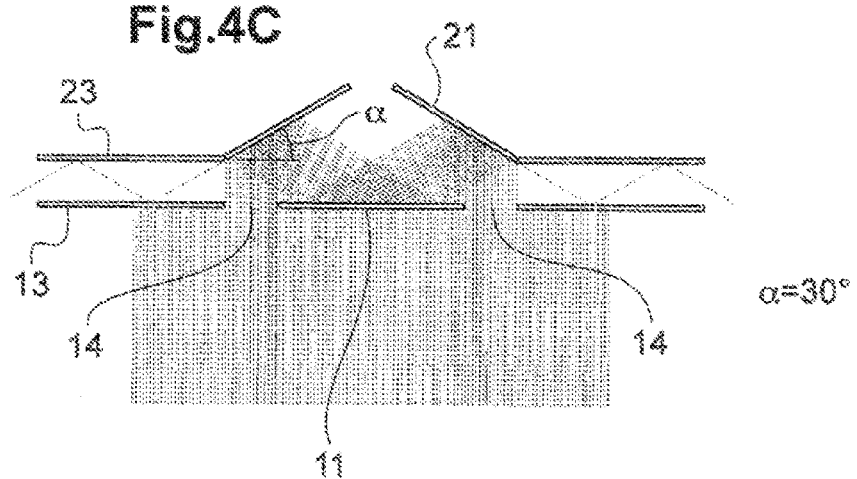
Figure 4D:
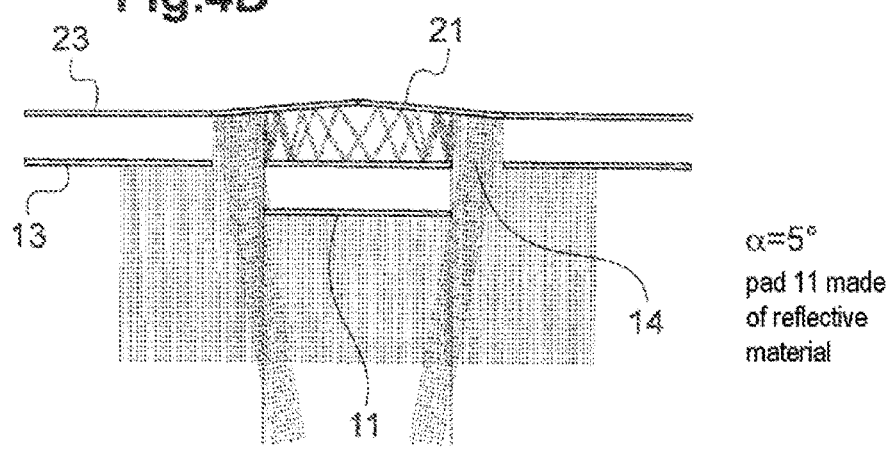

These simulations are shown in FIGS. 4A to 4F, respectively.

Table 1 below indicates the conditions corresponding to each of these figures and results qualifying and quantifying the focus, if one were obtained, of the UV radiation on the interconnection zone 4 in question, i.e. the zones simulating the location of an indium bump 4.

TABLE 1

| FIG. | Value of the angle α | Results |
|---|---|---|
| 4A | 45° | No reflected UV rays reach the zone 4 in question |
| 4B | 40° | No rays reflected onto the pad 11. In contrast, good focus on the zone 4 in question. However, many rays transmitted into the layer 3 of CuO after reflection from the reflecting pad 21 |
| 4C | 30° | 48% of the UV flux reaches the zone 4 in question. A few rays are transmitted into the layer 3 of CuO but the effect is marginal (reflection from the corner of the structure) |
| 4D | 5° | 60% of the flux reaches the zone 4 in question provided that the pad 11 also reflects UV |
| 4E | 10° | 63% of the flux reaches the pad 11 and the zone 4 in question, with a pad 11 that reflects UV |
| 4F | 10° | 10% of the flux reaches the pad 11, with a pad 11 that absorbs UV. However, the rays do not make it to the center of the zone 4 in question |

Thus, it is clear from table 1 that the angle at the base α of the Isosceles triangle formed by the pad 21 must be smaller than 40° and that the pad 11 must preferably be made of a material that reflects UV.

The same type of simulations were carried out but this time with pads 21 having a cylinder-segment shape.

These simulations are shown in FIGS. 5A and 5B, respectively.

Table 2 below indicates the conditions corresponding to each of these figures and results qualifying and quantifying the focus, if one were obtained, of the UV radiation on the interconnection zone 4 in question, i.e. in the zones simulating the location of an indium bump 4.

It will be noted that the dimensions of the cylinder-segment shape 21 are the same in FIGS. 5A and 5B, namely a radius of curvature R equal to 50 µm and a height equal to 10 µm.

TABLE 2

| FIG. | Material of the pad 11 | Results |
|---|---|---|
| 5A | reflects UV | 62% of the flux reaches the pad 11 |
| 5B | absorbs UV | 22% of the flux reaches the pad 11 and furthermore only its center |

Thus, it is clear from table 2 that with a cylinder-segment-shaped pad 21 the pad 11 must preferably be made of a material that reflects UV radiation.

The various assembly steps according to the first alternative of the invention are now described with reference to FIGS. 6A to 6G. It will be noted that in these figures only those portions of the components 1, 2 in which a mechanical and electrical interconnection is obtained in the assembly process have been shown.

It goes without saying that it is possible to produce a large number, typically equal to about ten thousand, of interconnections between the two components, by implementing the assembly process according to the invention.

Step a/: the first component 1 is produced with its connection pads 11 on its assembly face 12, from a flexible substrate 10 made of PEN or of PET.

To do this, firstly, on the assembly face 12 of the substrate 10, a metal layer that reflects ultraviolet radiation and that is from 30 to 300 nm in thickness is deposited using a physical vapor deposition (PVD) technique.

The constituent material of the layer may be aluminum (Al) aluminum (Al). It may also be a question of gold (Au), titanium (Ti), nickel (Ni) or platinum (Pt).

Once the deposition has been carried out, the layer is etched so as to form the connection pads 11 (FIG. 6A).

The etching may be wet etching or plasma etching or laser etching.

Next, again on the assembly face 12, a layer 13 of an electrically insulating material that absorbs or reflects UV radiation is deposited, said layer defining, around the connection pads, emission zones 14 through which UV radiation will subsequently be emitted to finalize the assembly (FIG. 6B).

The layer 13 may be the same thickness as the connection pads 11. The layer 13 may be made from a titanium oxide, such as $TiO_2$. It may also be a question of a layer 13 made of zinc oxide (ZnO), zirconium oxide ($ZrO_2$), or in the form of pyrene molecules dissolved in acetone.

Step b/: next, copper oxide CuO in ink form is deposited in order to form a film 3 covering the assembly face 12 of the first component 1 (FIG. 6C).

The CuO ink may be deposited by screen printing. By way of example, it may be a question of the ink sold under the denomination "Metalon® ICI-020" or even "Metalon® ICI-021" by Novacentrix.

The thickness of the deposited CuO ink may advantageously be comprised between 2 μm and 10 μm.

Step c/: the second component 2 is produced with its connection pads 21 on its assembly face 22, from a silicon chip 20.

Firstly, Isosceles-triangle shapes are formed in the silicon chip 20. These shapes are produced either by isotropic etching, wet etching, i.e. wet etching in potassium hydroxide (KOH), for example, or laser etching, for example with a femtosecond laser.

Next, a layer made of a material that reflects UV radiation is deposited by PVD and subsequently etched to form the connection pads 21, which closely follow the Isosceles-triangle shapes.

The thickness of the deposited layer 21 may advantageously be comprised between 30 nm and 2 μm.

Next, once the connection pads 21 have been formed, a passivation layer 23 is deposited. It may be a question of a conventional passivation using a layer of silicon oxide ($SiO_2$) obtained by thermal oxidation or deposited by PECVD or a layer of silicon nitride ($Si_3N_4$).

Step d/: an indium bump 4 is deposited on each connection pad 21 made of a material that reflects UV (FIG. 6D).

The deposition of the indium bumps 4 may be carried out using one of two known methods, namely dispensing or liftoff followed by evaporation.

The unitary volume of an indium bump 4 may vary between 520 $\mu m^3$ and 34000 $\mu m^3$, this corresponding to diameters varying between 10 μm and 40 μm.

Step e/: the first component 1 is flipped, then the two components 1, 2 are brought close together and aligned with each other so that each connection pad 11, 21 faces the other with a connection bump 4 in between (FIG. 6E).

Lastly, the first component 1 is added to the second component 2 so that each connection bump 4 makes contact with a connection pad of the first component 1 (FIG. 6F).

Step e1/: the copper oxide (CuO) ink is thermally annealed at between 90 and 100° C. for between 10 min and 30 min so as to thermally activate the copper oxide.

Step f: next, ultraviolet radiation is briefly applied, via a photonic pulse in the UV wavelength range, through the transparent substrate 10 and the emission zones 14 (FIG. 6G).

The UV wavelength of the photonic pulse may advantageously be comprised between 200 and 400 nanometers.

The UV photonic pulse has a duration comprised between 0.5 and 2 milliseconds (ms) and an energy comprised between 10 and 20 joules/$cm^2$. Preferably, the duration is 1.5 ms for an energy of 14 joules/$cm^2$. With such energy values, an angle α of about 10° and pads 11 made of aluminum, not only is the CuO reliably converted into Cu from the back face 15 (face opposite the assembly face 12) of a flexible substrate made of PEN or of PET of thickness of about 125 μm, but the indium bumps 4 are also reliably melted.

In particular, the UV radiation acts as a reducing agent on the deposited CuO layer 3 having undergone a thermal anneal in step e1/, by generating hydrogen $H_2$ that will deoxidize the copper oxide and convert it into copper with formation of a water molecule.

By way of example, the UV photonic pulse may be produced by the xenon UV flash lamp sold under the denomination "XENON® PulseForge" by Xenon Cooperation.

The distance separating the UV flash lamp from the substrate 10 may be comprised between 2 and 7 cm. Advantageously, the distance between the lamp and the back face 15 of the substrate 10 is about 2.5 cm. Such a distance is advantageous because it corresponds to the length required to focus the photonic pulse by the optical system of the UV flash lamp and therefore to the length at which a maximum amount of energy is delivered.

FIG. 6G shows an assembly of the two components 1, 2 obtained using the assembly process just described.

The indium bumps 40, which however have a melting point above the glass transition temperature of the substrate 10, have been completely reflowed via a reflective focus on the reflective metal layer of the pads 21, without adversely affecting the substrate 10.

Simultaneously, the CuO ink 3 has been converted into Cu in the interconnection zones 30 defined between the reflective metal layer 21 and the emission zones 14.

Thus, the interconnections obtained in the zones 30 are obtained with a good electrical contact made of copper and at the same time a good electrical and mechanical contact via the bumps 40 reflowed under the energy delivered by the UV flash(es).

Furthermore, the assembly obtained allows any heat due to the heating of the silicon chip 1 in operation to be effectively removed by way of the continuous CuO layer 3. In particular, CuO has a thermal conductivity of 33 W/m·K, much better than air, which has a conductivity of 0.02 W/m·K.

Provision may be made for other variants and improvements, without however departing from the scope of the invention.

Thus, it may be envisioned to assemble, according to the invention, two printed circuit boards on transparent flexible substrates made of PEN or PET, or one component by way of detector on a transparent substrate and another component by way of read circuit, or a sensor and another sensor with one thereof on a transparent substrate.

The invention is not limited to the examples just described; it is especially possible to combine features of the illustrated examples together in variants that have not been illustrated.

The invention claimed is:

1. A process for flip-chip assembly of a first component and a second component, each component including connection pads on one of their faces, called their assembly faces, in which the components are added one to the other via their assembly faces so as to produce electrical interconnections between the pads of the first and those of the second component, the process including the following steps:
   a/ producing the first component with its connection pads, the first component being made of a material that is transparent to ultraviolet (UV) radiation in zones, called emission zones, each of said emission zones being defined around a pad, the pads of the first component being made of a material that absorbs or reflects UV radiation;
   b/ depositing copper oxide (CuO) on the first component at least on its connection pads and in the emission zones;
   c/ producing the second component with its connection pads, the connection pads of the second component being made of a material that reflects UV radiation, each of said pads being suitable for reflectively focusing ultraviolet radiation arriving from an emission zone onto one of the pads of the first component, and, depending on the circumstances, onto each metal protuberance formed on a pad of the second component;
   d/ forming interconnection metal protuberances on at least some of the pads of the second component;
   e/ aligning the first and second components and adding them one to the other via their assembly faces; and
   f/ applying UV radiation through the emission zones of the first component to the deposited copper oxide so as to carry out a UV anneal that converts the deposited copper oxide into copper and, depending on the circumstances, makes the interconnection protuberances melt.

2. The assembly process as claimed in claim 1, in which the first component includes a substrate made of a material that is transparent to UV.

3. The assembly process as claimed in claim 2, wherein the substrate made of transparent material is surmounted, on the same side as its assembly face, with an electrically insulating layer made of a material that absorbs or reflects UV radiation, said layer defining the emission zones.

4. The assembly process as claimed in claim 3, wherein the constituent material of the layer defining the emission zones is chosen from a titanium oxide, such as $TiO_2$, zinc oxide (ZnO), zirconium oxide ($ZrO_2$) and molecules of pyrene dissolved in acetone.

5. The assembly process as claimed in claim 2, wherein the substrate made of transparent material is surmounted, on the same side as its assembly face, with a layer made of a material that absorbs or reflects UV radiation and electrically insulated from the emission zones and connection pads.

6. The assembly process as claimed in claim 5, wherein the constituent material of the layer electrically insulated from the emission zones and connection pads is a metal such as gold (Au), titanium (Ti) or nickel (Ni).

7. The assembly process as claimed in claim 1, wherein the first component is a substrate made of transparent material and in which the emission zones are defined by drops of a solvent that absorbs UV radiation added to copper oxide (CuO).

8. The assembly process as claimed in claim 7, wherein the solvent is chosen from water, acetonitrile, pentane, n-hexane, cyclohexane and cyclopentane.

9. The assembly process as claimed in claim 1, wherein step b/ is carried out by depositing CuO in the form of an ink in order to produce a film covering the assembly face of the first component.

10. The process as claimed in claim 9, wherein, between steps e/ and f/, a step e1/ of thermally annealing the copper oxide (CuO) ink is carried out between 90 and 100° C. for a time of 10 min to 30 min so as to thermally activate the copper oxide.

11. The assembly process as claimed in claim 1, wherein the UV radiation applied in step f/ consists in a photonic pulse of a duration comprised between 0.5 and 2 milliseconds (ms) having an energy comprised between 10 and 20 joules/cm$^2$.

12. An assembly of a first component and a second component, each component including connection pads on one of their faces, called their assembly faces, in which:
   the first component is made of a material that is transparent to ultraviolet radiation (UV) at least in zones, called emission zones, and includes connection pads made of a material that absorbs or reflects UV radiation, said pads each being bounded by emission zones; and
   the second component includes connection pads made of a material that reflects UV radiation,
   the assembly including:
      interconnection zones made of copper (Cu) each filling the space at least between the emission zones of the first component and a pad of the second component; and
      depending on the circumstances, metal protuberances each reflowed in an interconnection zone between a pad of the first component and a pad of the second component.

13. The assembly as claimed in claim 12, the first component including a substrate made of a material that is transparent to UV.

14. The assembly as claimed in claim 13, the substrate being made of polyethylene naphthalate (PEN), polyethylene terephthalate (PET) or of glass.

15. The assembly as claimed in claim 12, the connection pads of the second component being made of a material that reflects UV radiation and having a recessed, Isosceles-triangle shape relative to the assembly face.

16. The assembly as claimed in claim 15, the angle α at the base, angle formed between the two sides of the Isosceles triangle and the assembly face of the second component, being smaller than 40°.

17. The assembly as claimed in claim 12, the connection pads of the second component being made of a material that reflects UV radiation and having a concave shape relative to the assembly face, the concave shape consisting of a parabolic or cylinder segment.

18. The assembly as claimed in claim 12, the connection pads of the first component being made of a material that reflects UV radiation.

19. The assembly as claimed in claim 12, the connection pads of the second component being produced in the form of a metal layer the metal of which is chosen from aluminum (Al), gold (Au), titanium (Ti), nickel (Ni) and platinum (Pt), or of a metal bilayer chosen from nickel surmounted with gold (Ni/Au) and nickel surmounted with platinum (Ni/Pt).

20. The assembly as claimed in claim 12, the constituent material of the interconnection protuberances being chosen from indium (In), an aluminum-copper alloy (AlCu), tin (Sn) and a gold-tin alloy (AuSn).

21. The assembly as claimed in claim 12, the second component being a chip, in particular a silicon chip, and the first component being a substrate made of transparent material surmounted, on the same side as its assembly face, with a layer that absorbs UV radiation, defining the emission zones.

\* \* \* \* \*